(12) United States Patent
Chang et al.

(10) Patent No.: US 12,154,969 B2
(45) Date of Patent: Nov. 26, 2024

(54) SEMICONDUCTOR DEVICE STRUCTURE WITH METAL GATE STACK

(71) Applicant: Taiwan Semiconductor Manufacturing Company, Ltd., Hsinchu (TW)

(72) Inventors: Jung-Hao Chang, Taichung (TW); Li-Te Lin, Hsinchu (TW); Pinyen Lin, Rochester, NY (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/532,568

(22) Filed: Nov. 22, 2021

(65) Prior Publication Data

US 2022/0085189 A1    Mar. 17, 2022

Related U.S. Application Data

(62) Division of application No. 16/676,057, filed on Nov. 6, 2019, now Pat. No. 11,183,580.

(60) Provisional application No. 62/854,519, filed on May 30, 2019.

(51) Int. Cl.
| | |
|---|---|
| *H01L 29/66* | (2006.01) |
| *H01L 21/8238* | (2006.01) |
| *H01L 27/092* | (2006.01) |
| *H01L 29/49* | (2006.01) |
| *H01L 29/51* | (2006.01) |
| *H01L 29/78* | (2006.01) |

(52) U.S. Cl.
CPC ........ *H01L 29/66545* (2013.01); *H01L 21/823821* (2013.01); *H01L 27/0924* (2013.01); *H01L 29/4966* (2013.01); *H01L 29/513* (2013.01); *H01L 29/66795* (2013.01); *H01L 29/785* (2013.01); *H01L 29/517* (2013.01)

(58) Field of Classification Search
CPC ......... H01L 21/76834; H01L 21/76897; H01L 21/82345; H01L 21/823456; H01L 21/823475; H01L 21/823821; H01L 27/088; H01L 27/0924; H01L 29/165; H01L 29/4966; H01L 29/513; H01L 29/517; H01L 29/66545; H01L 29/66795; H01L 29/7848; H01L 29/785
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |

(Continued)

*Primary Examiner* — Shaun M Campbell
(74) *Attorney, Agent, or Firm* — Birch, Stewart, Kolasch & Birch, LLP

(57) ABSTRACT

A semiconductor device structure is provided. The semiconductor device structure includes a substrate and a metal gate stack over the substrate. The metal gate stack has a gate dielectric layer and a work function layer over the gate dielectric layer. The semiconductor device structure also includes a spacer structure over a sidewall of the metal gate stack. A topmost surface of the gate dielectric layer is lower than a topmost surface of the spacer structure. The topmost surface of the gate dielectric layer is closer to the topmost surface of the spacer structure than a topmost surface of the work function layer.

20 Claims, 17 Drawing Sheets

(56) References Cited

U.S. PATENT DOCUMENTS

| | | |
|---|---|---|
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,847,398 B1* | 12/2017 | Hung ............... H01L 29/41791 |
| 9,859,165 B1* | 1/2018 | Wu .................. H01L 21/31055 |
| 10,050,149 B1 | 8/2018 | Huang et al. |
| 10,229,983 B1* | 3/2019 | Bu ................... H01L 29/42376 |
| 10,867,870 B1 | 12/2020 | Yang et al. |
| 2011/0147858 A1 | 6/2011 | Lim et al. |
| 2012/0244669 A1 | 9/2012 | Liao et al. |
| 2013/0087833 A1 | 4/2013 | Wang |
| 2013/0187203 A1 | 7/2013 | Xie et al. |
| 2013/0320410 A1 | 12/2013 | Lin et al. |
| 2014/0203333 A1* | 7/2014 | Huang ............. H01L 29/66545 257/288 |
| 2015/0118835 A1* | 4/2015 | Lin .................. H01L 29/66477 438/586 |
| 2015/0214330 A1 | 7/2015 | Wan et al. |
| 2016/0056263 A1* | 2/2016 | Grasshoff ......... H01L 21/76834 438/692 |
| 2016/0284699 A1* | 9/2016 | Jeong ............... H01L 29/42376 |
| 2016/0343827 A1* | 11/2016 | Wu ....................... H01L 29/78 |
| 2016/0365449 A1* | 12/2016 | Chang ................ H01L 29/6656 |
| 2016/0372377 A1* | 12/2016 | Mukherjee ........... H01L 27/088 |
| 2016/0372566 A1* | 12/2016 | Chang ............. H01L 21/28008 |
| 2017/0154972 A1* | 6/2017 | Hsieh ................ H01L 29/6659 |
| 2017/0186743 A1* | 6/2017 | Chiou .................. H01L 29/785 |
| 2018/0012806 A1* | 1/2018 | Li ...................... H01L 29/4966 |
| 2018/0040734 A1* | 2/2018 | Chang .............. H01L 29/42376 |
| 2018/0068951 A1* | 3/2018 | Hung ............. H01L 21/823871 |
| 2018/0151565 A1 | 5/2018 | Lee et al. |
| 2018/0350947 A1* | 12/2018 | Liao ................ H01L 21/28123 |
| 2019/0165176 A1* | 5/2019 | Wang ................ H01L 29/7851 |
| 2020/0058748 A1* | 2/2020 | Bae .................... H01L 27/0886 |

* cited by examiner

SEMICONDUCTOR DEVICE STRUCTURE WITH METAL GATE STACK

PRIORITY CLAIM AND CROSS-REFERENCE

This Application is a Divisional of U.S. application Ser. No. 16/676,057, filed on Nov. 6, 2019, which claims the benefit of U.S. Provisional Application No. 62/854,519, filed on May 30, 2019, the entirety of which are incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
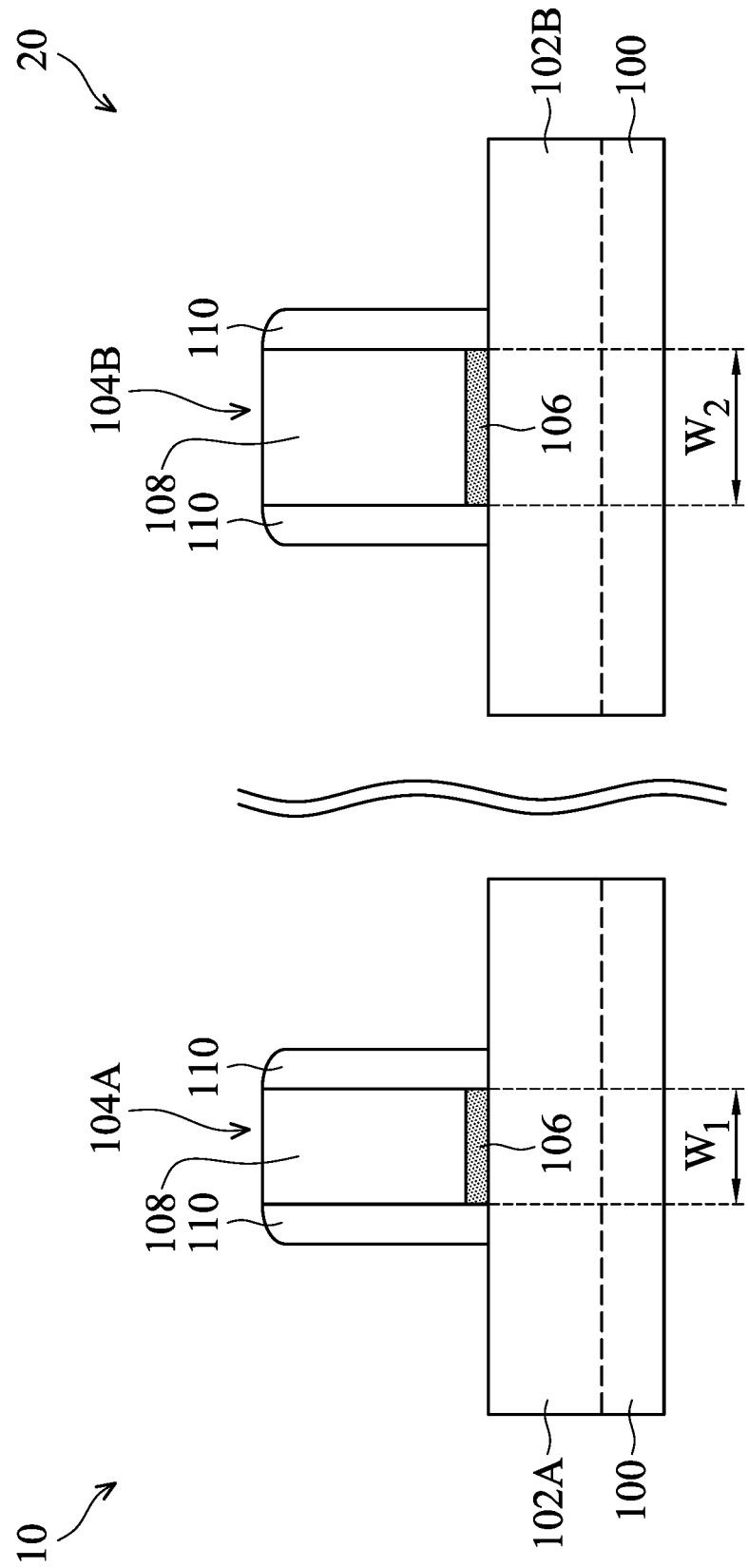
FIGS. 1A-1N are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Embodiments of the disclosure may relate to FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
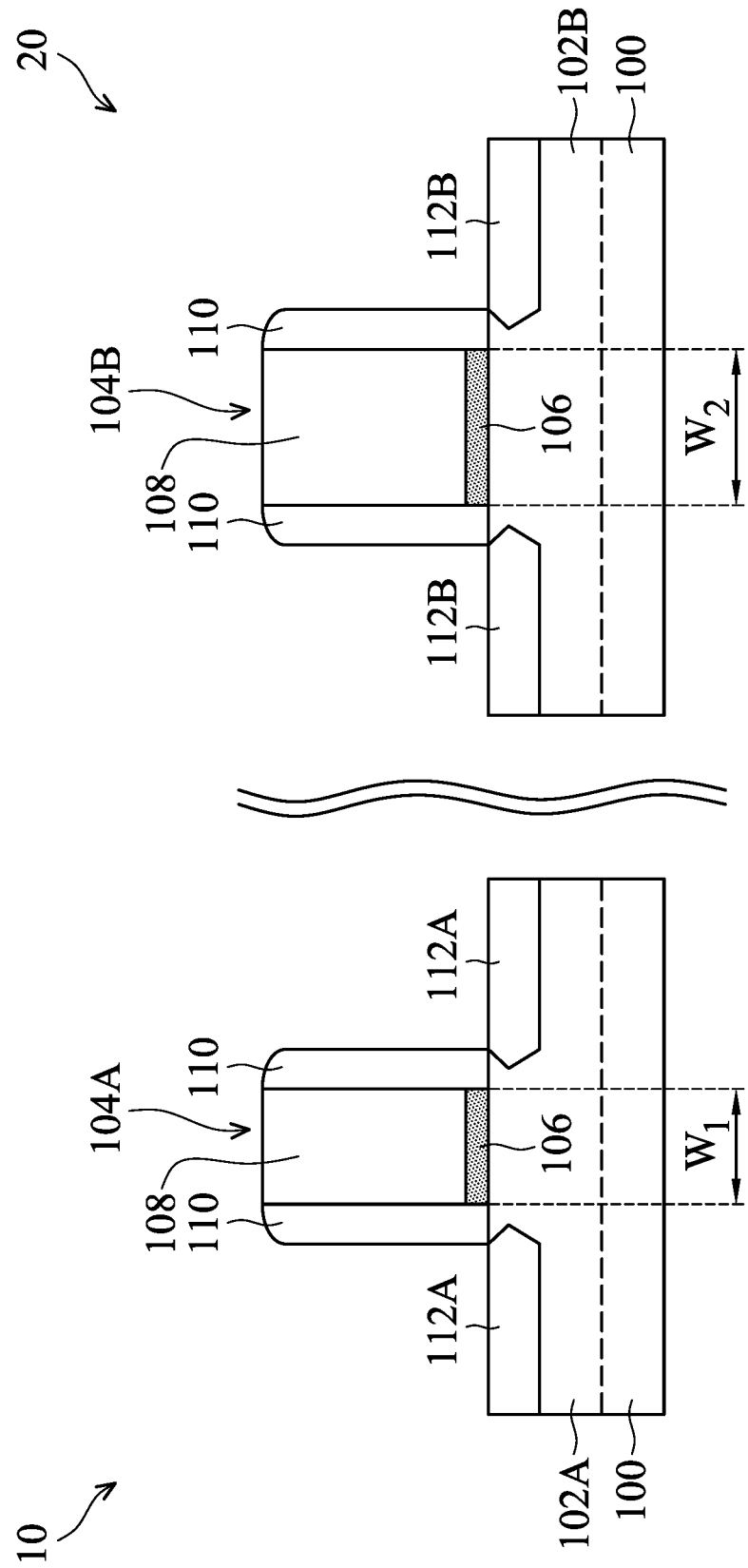
Figure 1C:
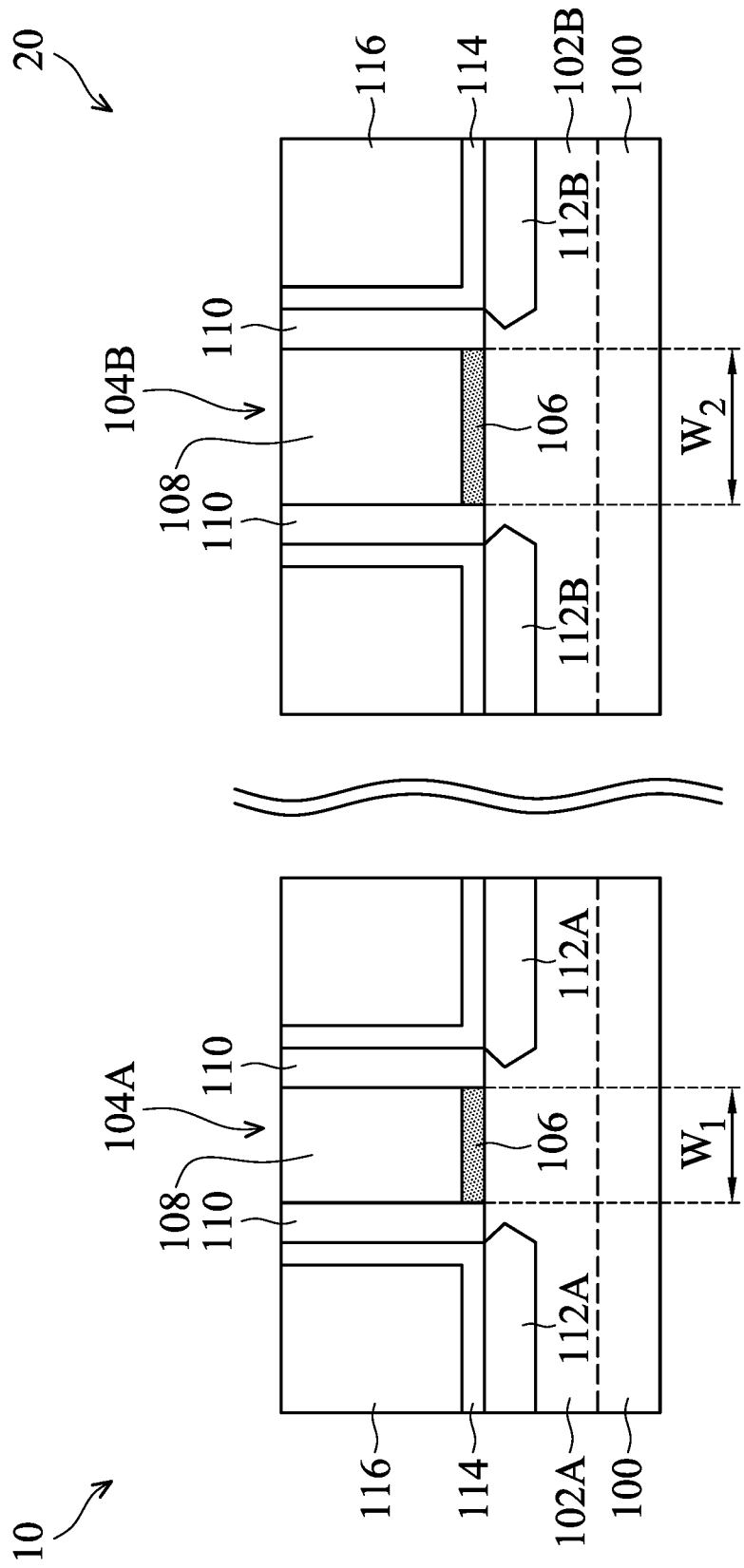
Figure 1D:
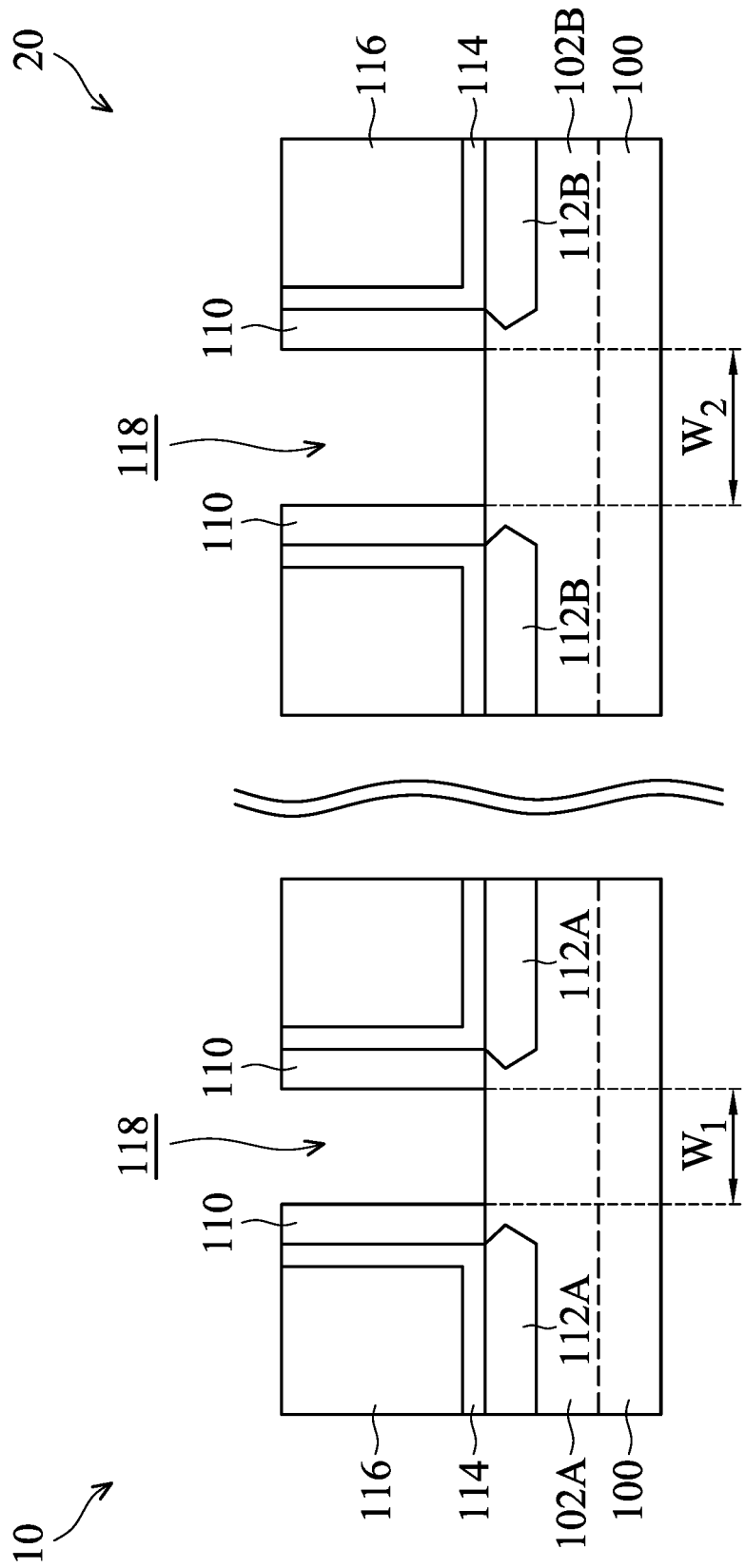
Figure 1E:
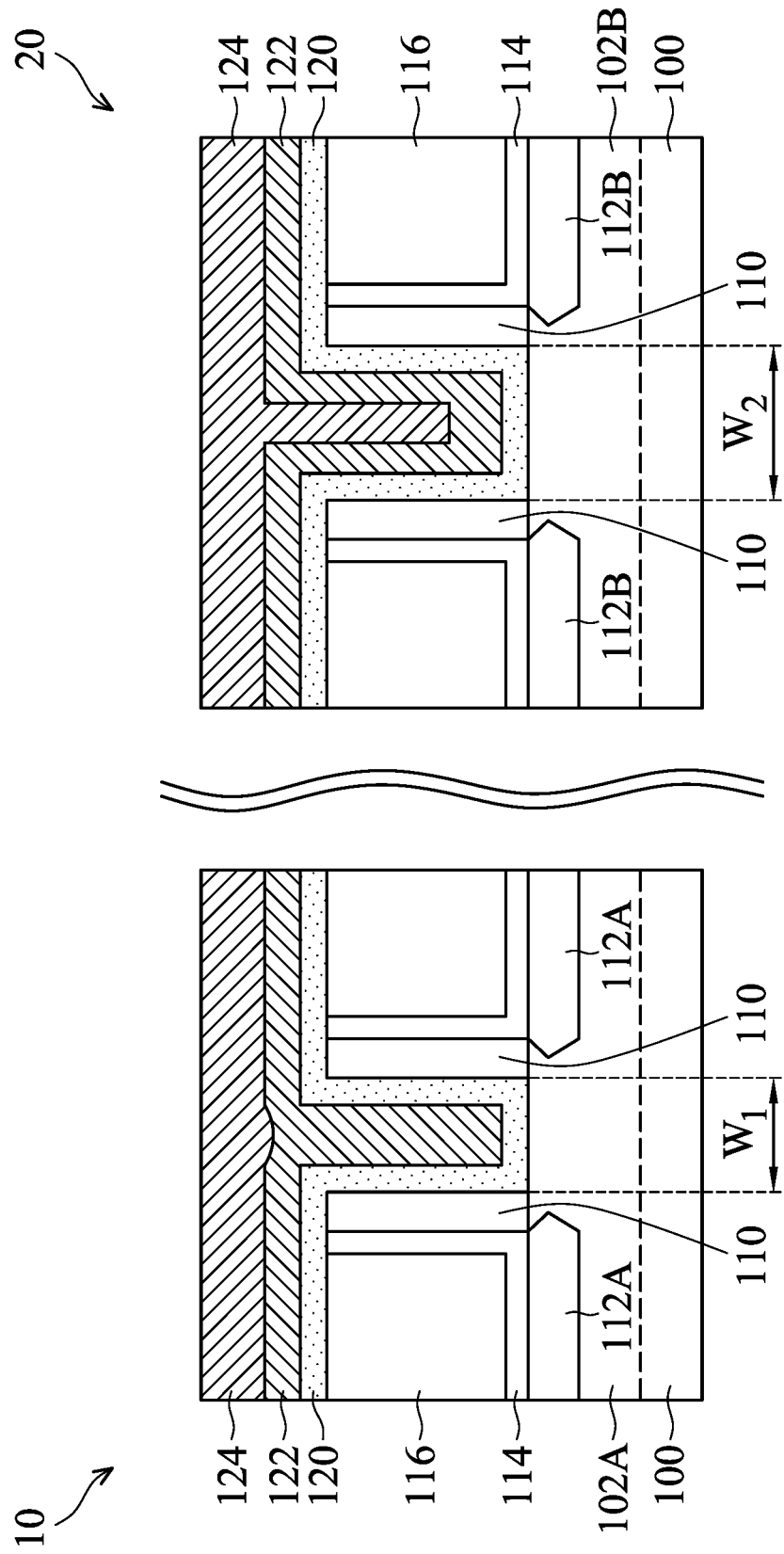
Figure 1F:
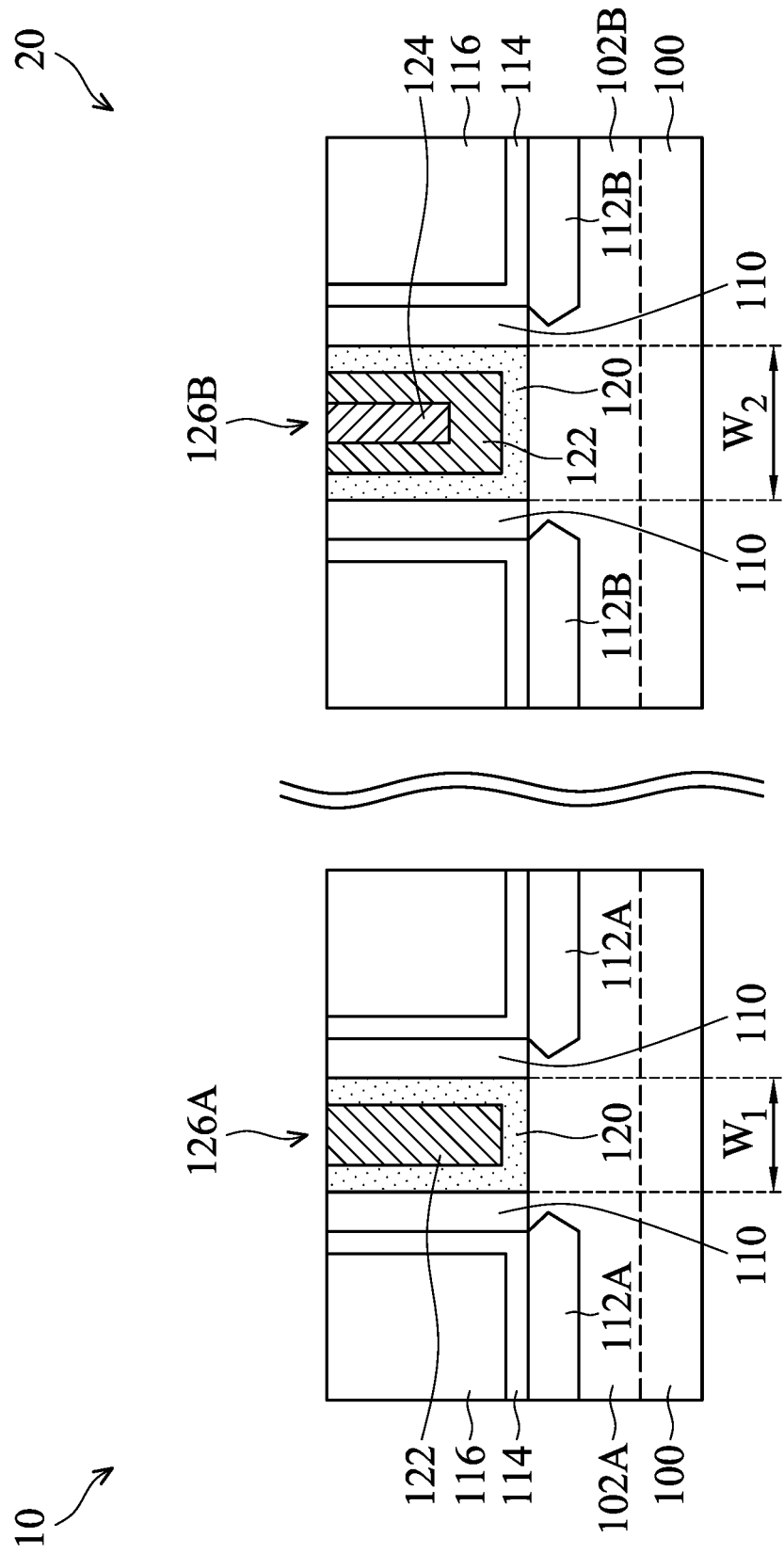
Figure 1G:
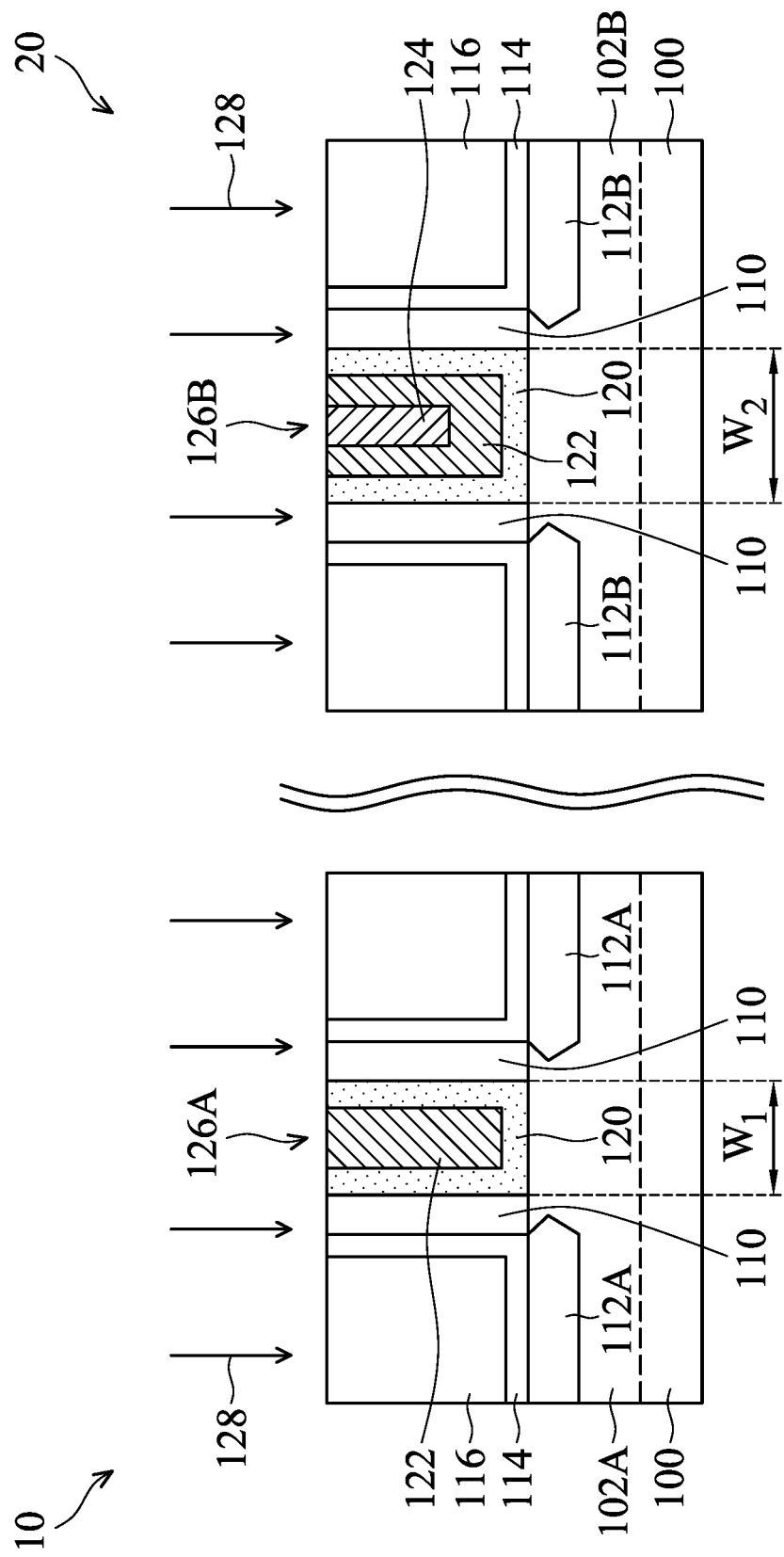
Figure 1H:
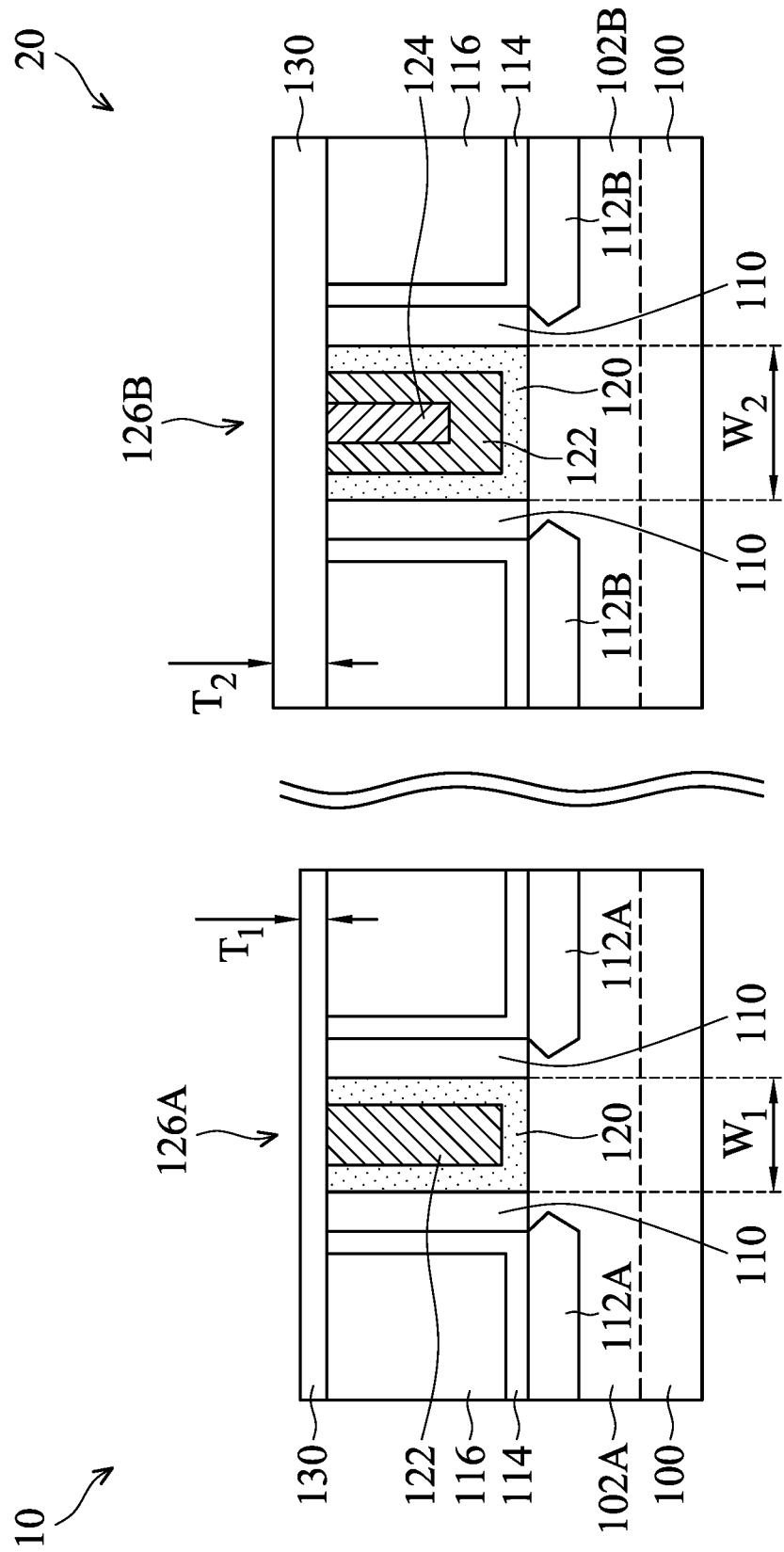
Figure 1I:
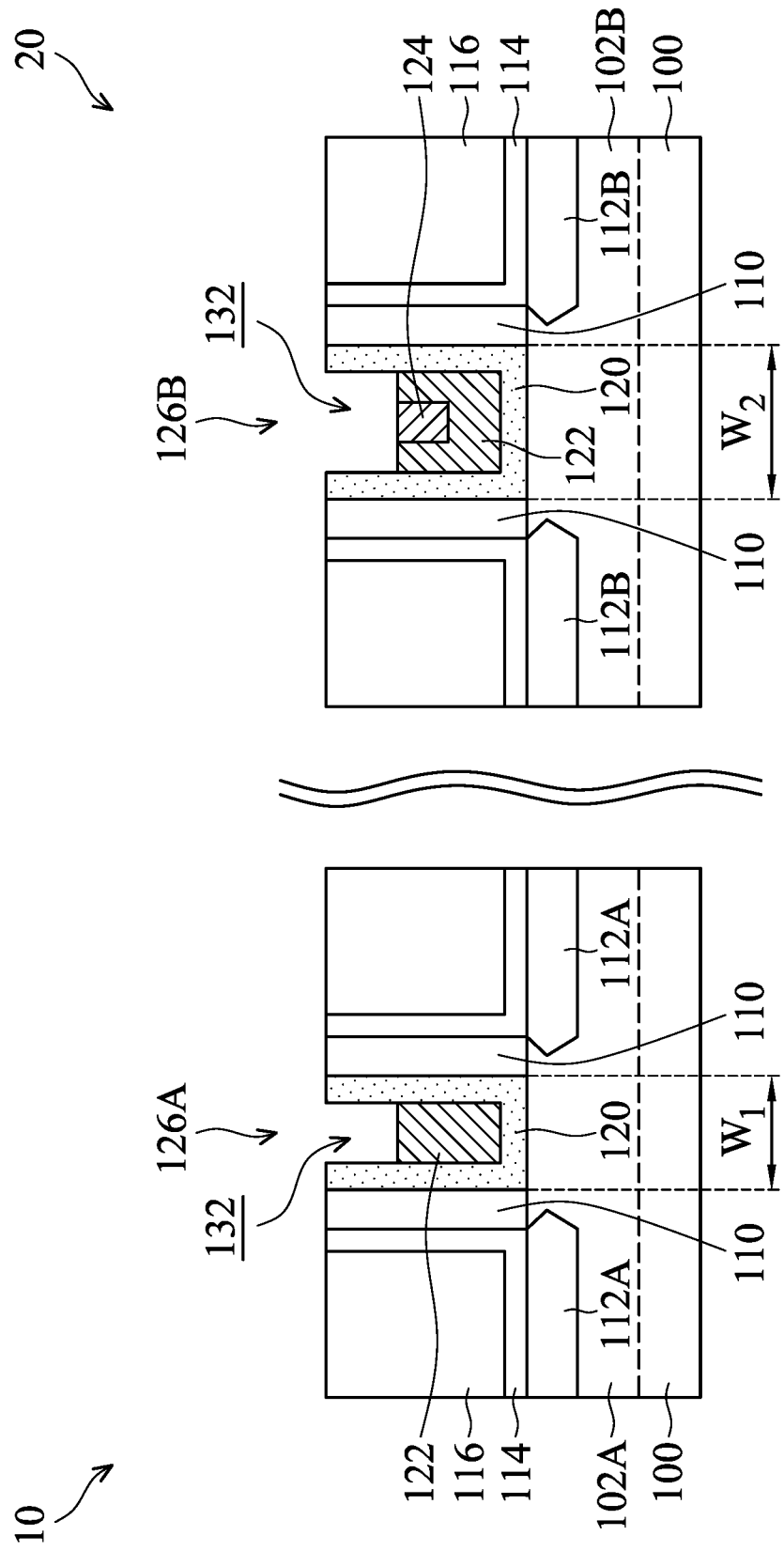
Figure 1J:
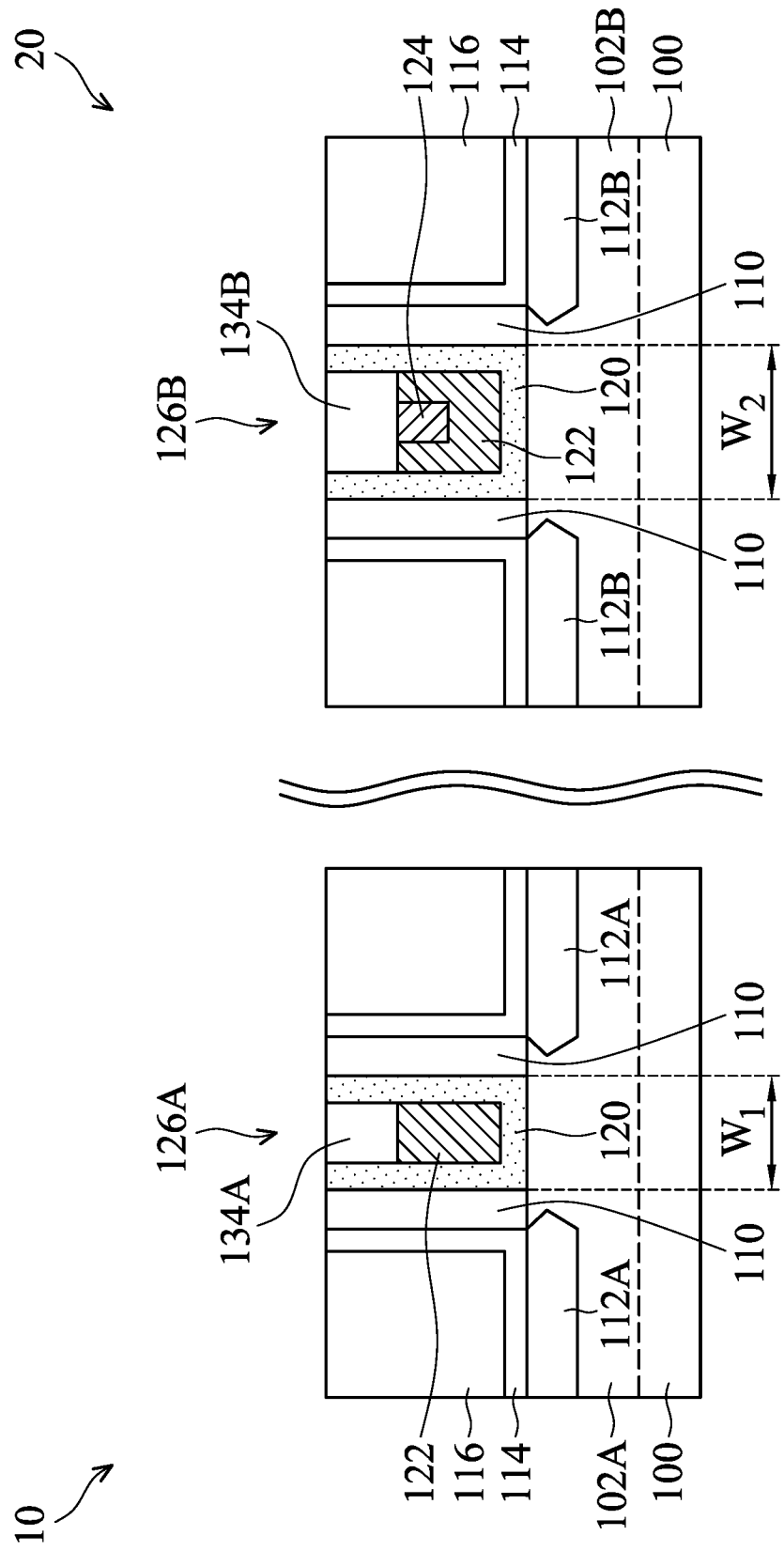
Figure 1K:
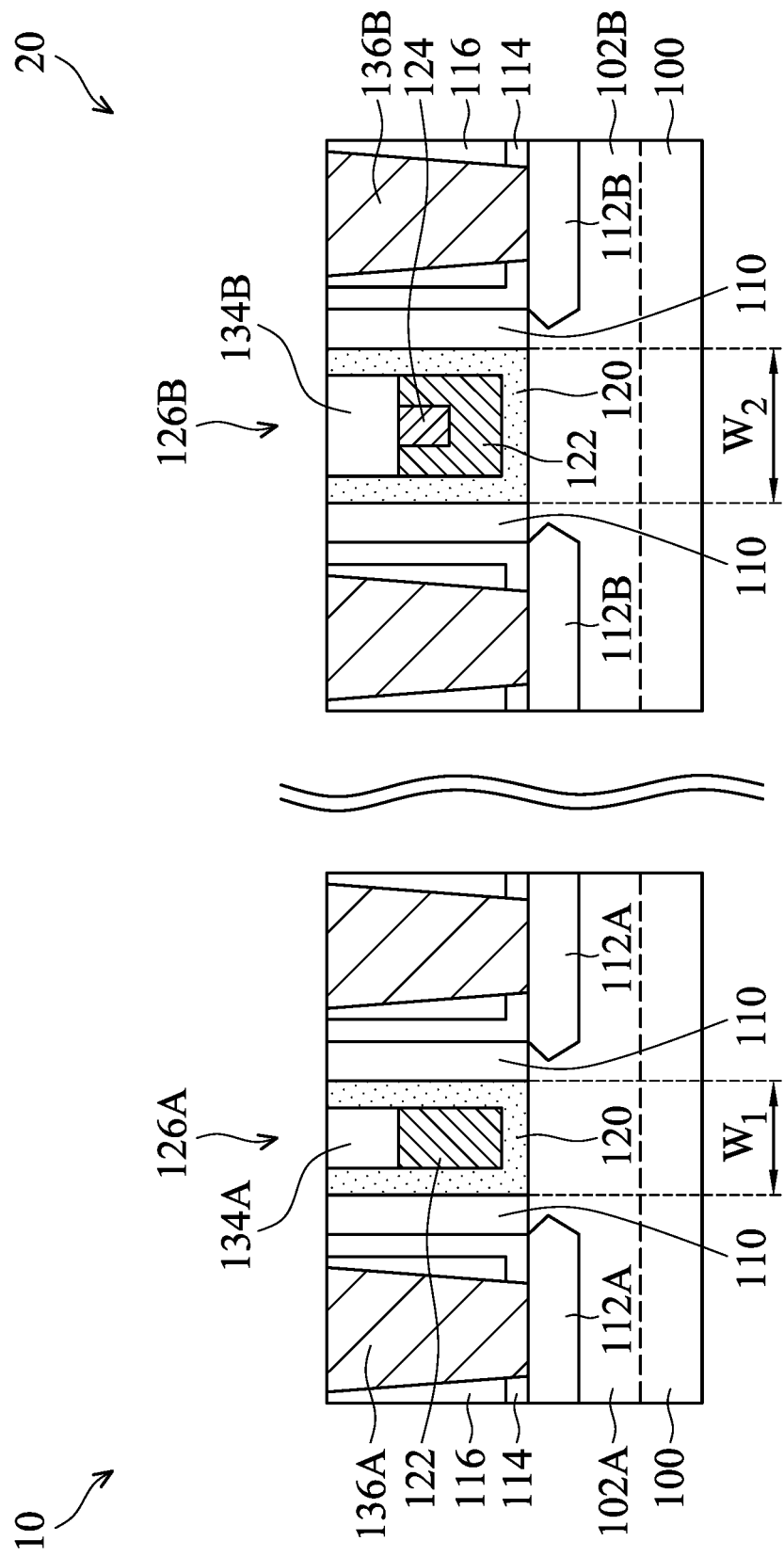
Figure 1L:
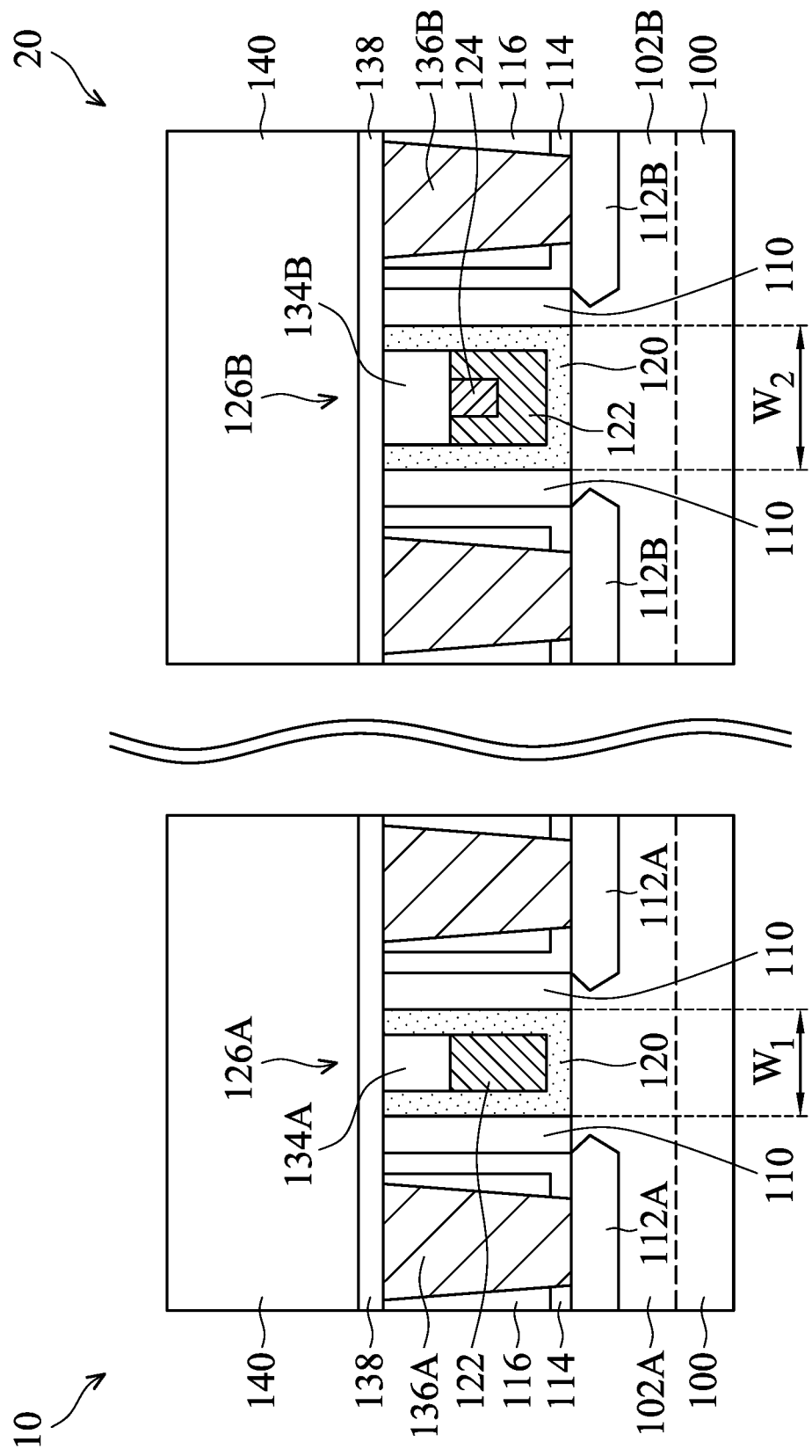
Figure 1M:
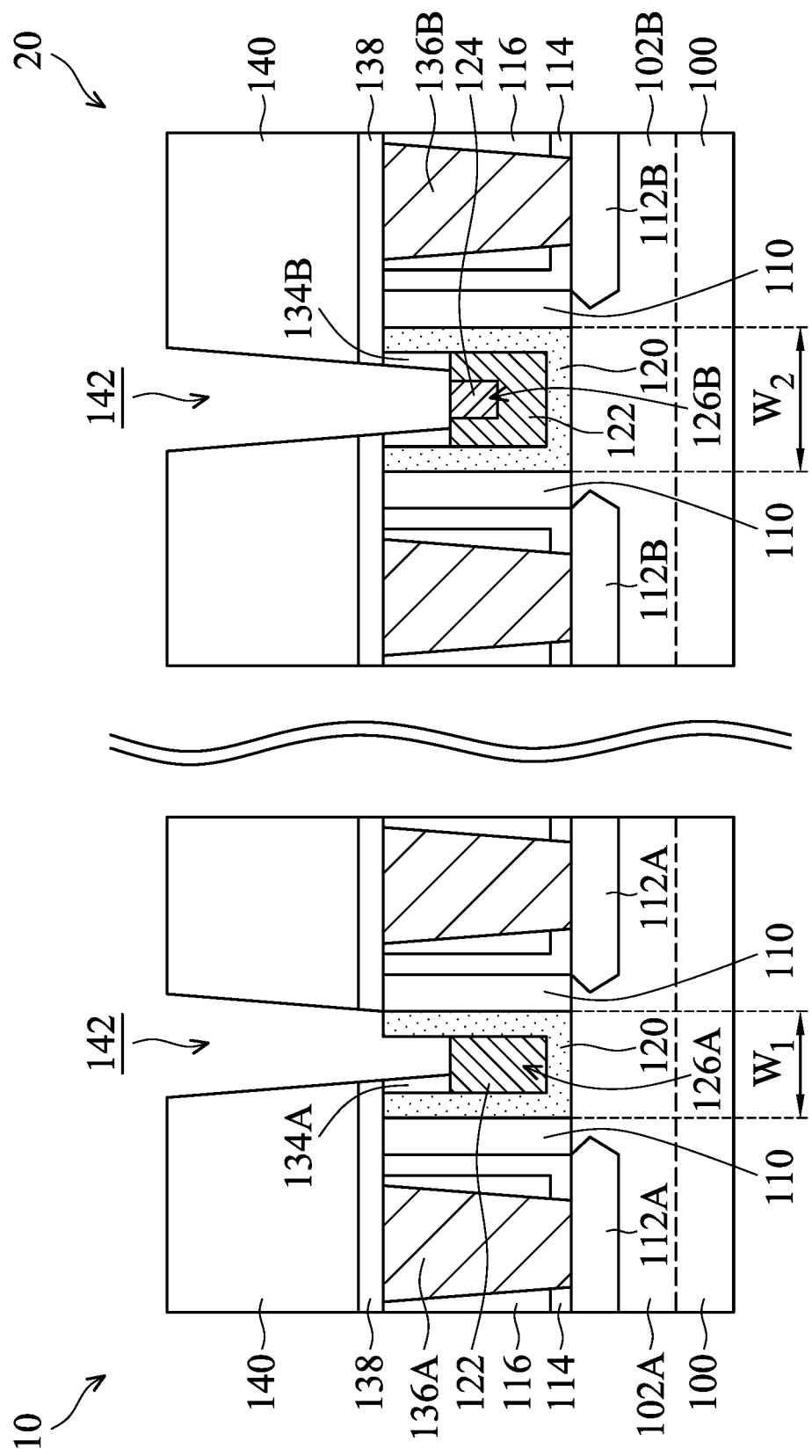
Figure 1N:
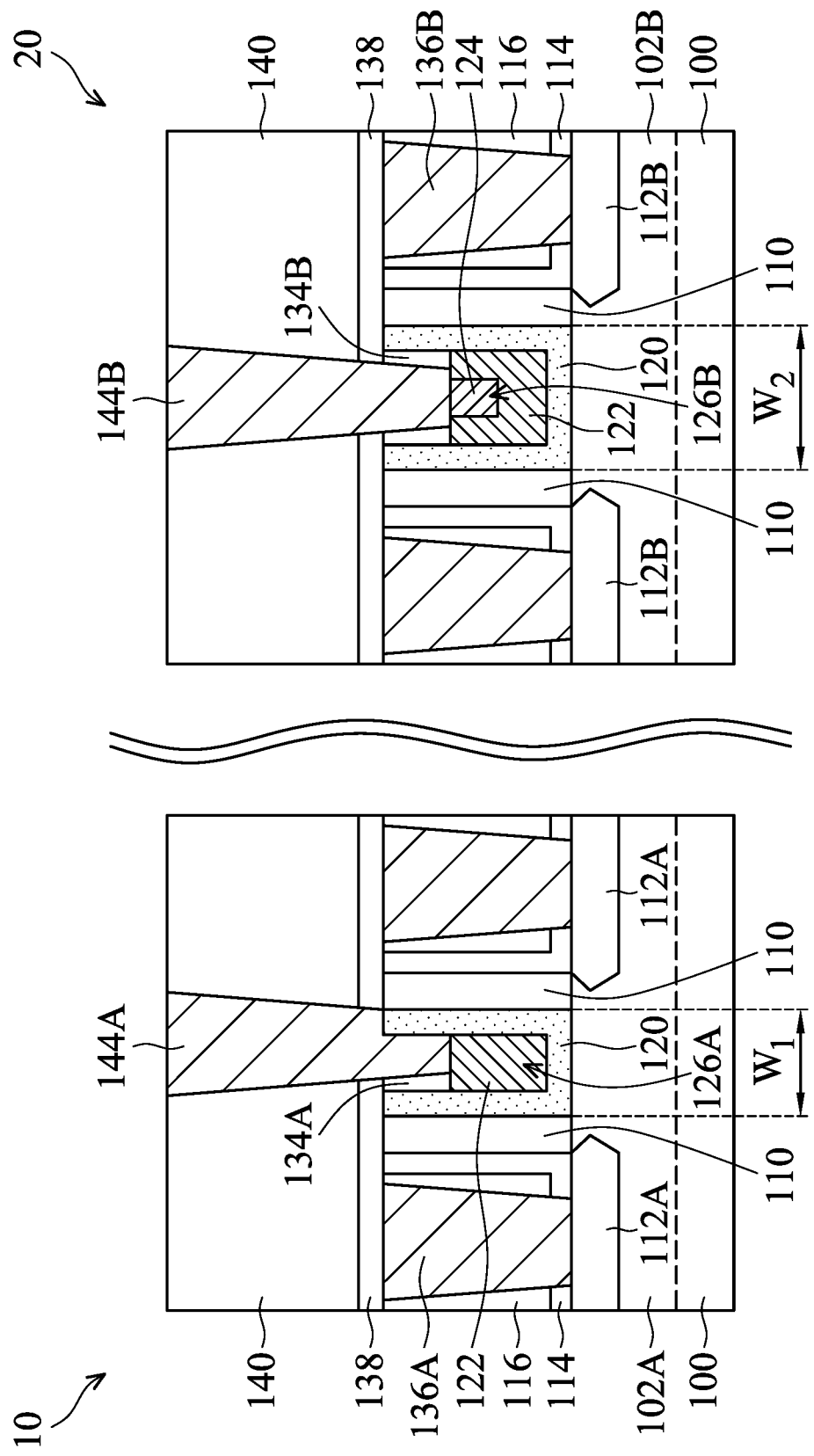

FIGS. 1A-1N are cross-sectional views of various stages of a process for forming a semiconductor device structure, in accordance with some embodiments. As shown in FIG. 1A, a semiconductor substrate 100 is received or provided. The semiconductor substrate 100 includes regions 10 and 20. In some embodiments, narrower gate stacks and wider gate stacks are designed to be formed over the regions 10 and 20, respectively. In some embodiments, the distribution densities of the gate stacks over the regions 10 and 20 are different. In some embodiments, the distribution densities of the gate stacks over the region 10 is greater than the distribution densities of the gate stacks over the region 20.

In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 1A, multiple fin structures 102A and 102B are formed, in accordance with some embodiments. In some embodiments, multiple recesses (or trenches) are formed in the semiconductor substrate 100. As a result, multiple fin structures that protrude from the surface of the semiconductor substrate 100 are formed or defined between the recesses. In some embodiments, one or more photolithography and etching processes are used to form the recesses. In some embodiments, the fin structures 102A and 102B are in direct contact with the semiconductor substrate 100.

However, embodiments of the disclosure have many variations and/or modifications. In some other embodiments, the fin structures 102A and 102B are not in direct contact with the semiconductor substrate 100. One or more other material layers may be formed between the semiconductor substrate 100 and the fin structures 102A and 102B. For example, a dielectric layer may be formed between the semiconductor substrate 100 and the fin structures 102A and 102B.

Afterwards, isolation features (not shown) are formed in the recesses to surround a lower portion of the fin structures 102A and 102B, in accordance with some embodiments. The isolation features are used to define and electrically isolate various device elements formed in and/or over the semiconductor substrate 100. In some embodiments, the isolation features include shallow trench isolation (STI) features, local oxidation of silicon (LOCOS) features, another suitable isolation feature, or a combination thereof.

In some embodiments, each of the isolation features has a multi-layer structure. In some embodiments, the isolation features are made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation features. Similarly, the STI liner may also be used to reduce crystalline defects at the interface between the fin structures and the isolation features.

In some embodiments, a dielectric material layer is deposited over the semiconductor substrate 100. The dielectric material layer covers the fin structures 102A and 102B and fills the recesses between the fin structures. In some embodiments, the dielectric material layer is deposited using a flowable chemical vapor deposition (FCVD) process, a chemical vapor deposition (CVD) process, an atomic layer deposition (ALD) process, a spin coating process, one or more other applicable processes, or a combination thereof.

In some embodiments, a planarization process is performed to thin down the dielectric material layer and to expose the fin structures 102A and 102B. The planarization process may include a chemical mechanical polishing (CMP) process, a grinding process, an etching process, a dry polishing process, one or more other applicable processes, or a combination thereof. Afterwards, the dielectric material layer is etched back to below the top of the fin structures 102A and 102B. As a result, the remaining portions of the dielectric material layer form the isolation features. The fin structures 102A and 102B protrude from the top surface of the isolation features.

As shown in FIG. 1A, dummy gate stacks 104A and 104B are formed over the semiconductor substrate 100, in accordance with some embodiments. The dummy gate stacks 104A and 104B partially cover and wrap around the fin structures 102A and 102B, respectively. As shown in FIG. 1A, the dummy gate stack 104A has a width $W_1$, and the dummy gate stack 104B has a width $W_2$. The width $W_2$ is greater than the width $W_1$.

In some embodiments, each of the dummy gate stacks 104A and 104B has a dummy gate dielectric layer 106 and a dummy gate electrode 108. The dummy gate dielectric layer 106 may be made of or include silicon oxide, silicon oxynitride, silicon nitride, one or more other suitable materials, or a combination thereof. The dummy gate electrode 108 may be made of or include a semiconductor material, such as polysilicon.

In some embodiments, a dielectric material layer and a gate electrode layer are sequentially deposited over the semiconductor substrate 100 and the fin structures 102A and 102B. The dielectric material layer may be deposited using a CVD process, an ALD process, a thermal oxidation process, a physical vapor deposition (PVD) process, one or more other applicable processes, or a combination thereof.

Afterwards, one or more photolithography processes and one or more etching processes may be used to partially remove the dielectric material layer and the gate electrode layer. As a result, the remaining portions of the dielectric material layer and the gate electrode layer form the dummy gate stacks 104A and 104B.

Afterwards, spacer elements 110 are formed over sidewalls of the dummy gate stacks 104A and 104B, as shown in FIG. 1A in accordance with some embodiments. The spacer elements 110 may be used to protect the dummy gate stacks 104A and 104B and assist in subsequent processes for forming source/drain features and/or metal gates. In some embodiments, the spacer elements 110 are made of or include a dielectric material. The dielectric material may include silicon nitride, silicon oxynitride, silicon oxide, silicon carbide, one or more other suitable materials, or a combination thereof.

In some embodiments, a dielectric material layer is deposited over the semiconductor substrate 100, the fin structures 102A and 102B, and the dummy gate stacks 104A and 104B. The dielectric material layer may be deposited using a CVD process, an ALD process, a spin coating process, one or more other applicable processes, or a combination thereof. Afterwards, the dielectric material layer is partially removed using an etching process, such as an anisotropic etching process. As a result, the remaining portions of the dielectric material layer over the sidewalls of the dummy gate stacks 104A and 104B form the spacer elements 110.

As shown in FIG. 1B, epitaxial structures 112A and 112B are respectively formed over the fin structures 102A and 102B, in accordance with some embodiments. The epitaxial structures 112A and 112B may function as source/drain features. In some embodiments, the portions of the fin structures 102A and 102B that are not covered by the dummy gate stacks 104A and 104B are recessed before the formation of the epitaxial structures 112A and 112B. In some embodiments, the recesses laterally extend towards the channel regions under the dummy gate stacks 104A and 104B. For example, portions of the recesses are directly below the spacer elements 110. Afterwards, one or more semiconductor materials are grown on sidewalls and bottoms of the recesses to form the epitaxial structures 112A and 112B.

In some embodiments, both the epitaxial structures 112A and 112B are p-type semiconductor structures. In some other embodiments, both the epitaxial structures 112A and 112B are n-type semiconductor structures. In some other embodiments, one of the epitaxial structures 112A and 112B is a p-type semiconductor structure, and another one is an n-type semiconductor structure.

A p-type semiconductor structure may include epitaxially grown silicon germanium or silicon germanium doped with boron. An n-type semiconductor structure may include epitaxially grown silicon, epitaxially grown silicon carbide (SiC), epitaxially grown silicon phosphide (SiP), or another suitable epitaxially grown semiconductor material.

In some embodiments, the epitaxial structures 112A and 112B are simultaneously formed. In some other embodiments, the epitaxial structures 112A and 112B are separately formed using separate processes, such as separate epitaxial growth processes. In some embodiments, a first mask element is used to cover the fin structure 102B while the epitaxial structures 112A are grown on the fin structure 102A. Afterwards, the first mask element is removed, and a second mask element is formed to cover the epitaxial structures 112A. The fin structure 102B is exposed without being covered by the second mask element. Then, the epitaxial structure 112B is grown on the fin structure 102B. Afterwards, the second mask element is removed, and the structure shown in FIG. 1B is obtained.

In some embodiments, the epitaxial structures 112A and 112B are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof.

In some embodiments, one or both of the epitaxial structures 112A and 112B are doped with one or more suitable dopants. For example, the epitaxial structures 112A and 112B are SiGe source/drain features doped with boron (B), indium (In), or another suitable dopant. Alternatively, in some other embodiments, one or both of the epitaxial structures 112A and 112B are Si source/drain features doped with phosphor (P), antimony (Sb), or another suitable dopant.

In some embodiments, the epitaxial structures 112A and 112B are doped in-situ during their epitaxial growth. In some other embodiments, the epitaxial structures 112A and 112B are not doped during the growth of the epitaxial structures 112A and 112B. Instead, after the formation of the epitaxial structures 112A and 112B, the epitaxial structures 112A and 112B are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 112A and 112B are further exposed to one or more annealing processes to activate the dopants. For example, a rapid thermal annealing process is used.

As shown in FIG. 1C, an etch stop layer 114 and a dielectric layer 116 are sequentially deposited over the semiconductor substrate 100 and the epitaxial structures 112A and 112B, in accordance with some embodiments. The etch stop layer 114 may conformally extend along the surfaces of the spacer elements 110 and the epitaxial structures 112A and 112B. The dielectric layer 116 covers the etch stop layer 114 and surrounds the spacer elements 110 and the dummy gate stacks 104A and 104B.

The etch stop layer 114 may be made of or include silicon nitride, silicon oxynitride, silicon carbide, one or more other suitable materials, or a combination thereof. In some embodiments, the etch stop layer 114 is deposited over the semiconductor substrate 100 and the dummy gate stacks 104A and 104B using a CVD process, an ALD process, a PVD process, one or more other applicable processes, or a combination thereof.

The dielectric layer 116 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. In some embodiments, the dielectric layer 116 is deposited over the etch stop layer 114 and the dummy gate stacks 104A and 104B using a CVD process, an ALD process, a FCVD process, a PVD process, one or more other applicable processes, or a combination thereof.

Afterwards, a planarization process is used to remove upper portions of the dielectric layer 116, the etch stop layer 114, the spacer elements 110, and the dummy gate stacks 104A and 104B. As a result, the top surfaces of the dielectric layer 116, the etch stop layer 114, the spacer elements 110, and the dummy gate stacks 104A and 104B are substantially level with each other, which benefits subsequent fabrication processes. The planarization process may include a CMP process, a grinding process, an etching process, a dry polishing process, one or more other applicable processes, or a combination thereof.

As shown in FIG. 1D, the dummy gate stacks 104A and 104B are removed to form recesses 118, in accordance with some embodiments. Each of the recesses 118 is between two of the spacer elements 110 that are opposite to each other. The recesses 118 expose portions of the fin structures 102A and 102B, as shown in FIG. 1D. One or more etching processes may be used to remove the dummy gate stacks 104A and 104B.

As shown in FIG. 1E, a gate dielectric layer 120 is deposited over the dielectric layer 116, in accordance with some embodiments. The gate dielectric layer 120 extends into the recesses 118 along the sidewalls and bottoms of the recesses 118. In some embodiments, the gate dielectric layer 120 conformally extends along the sidewalls of the recesses 118.

In some embodiments, the gate dielectric layer 120 is made of or includes a dielectric material with high dielectric constant (high-K). The gate dielectric layer 120 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof.

The gate dielectric layer 120 may be deposited using an ALD process, a CVD process, one or more other applicable processes, or a combination thereof. In some embodiments, the formation of the gate dielectric layer 120 involves a thermal operation.

In some embodiments, an interfacial layer is formed on the exposed surfaces of the fin structures 102A and 102B before the formation of the gate dielectric layer 120. The interfacial layer may be used to improve adhesion between the gate dielectric layer 120 and the fin structures 102A and 102B. The interfacial layer may be made of or include a semiconductor oxide material such as silicon oxide or germanium oxide. The interfacial layer may be formed using a thermal oxidation process, an oxygen-containing plasma operation, one or more other applicable processes, or a combination thereof.

Afterwards, a work function layer 122 is deposited over the gate dielectric layer 120, as shown in FIG. 1E in accordance with some embodiments. In some embodiments, the work function layer 122 fills the remaining space of the recess 118 over the region 10. In some embodiments, the work function layer 122 partially fills the recess 118 over the region 20. The work function layer 122 extends into the recess 118 along the sidewalls of the recess 118 over the region 20. In some embodiments, the work function layer 122 conformally extends along the sidewalls of the recess 118 over the region 20.

The work function layer 122 may be used to provide the desired work function for transistors to enhance device performance including improved threshold voltage. In some embodiments, the work function layer 122 is used for forming an NMOS device. The work function layer 122 is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

In some embodiments, the work function layer 122 is used for forming a PMOS device. The work function layer 122 is a p-type work function layer. The p-type work function layer is capable of providing a work function value that is suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer 122 may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer 122 may be fine-tuned to adjust the work function level. For example, a titanium nitride layer may be used as a p-type work function layer or an n-type work function layer, depending on the thickness and/or the compositions of the titanium nitride layer.

The work function layer 122 may be deposited over the gate dielectric layer 120 using an ALD process, a CVD process, a PVD process, an electroplating process, an electroless plating process, one or more other applicable processes, or a combination thereof.

In some embodiments, a barrier layer is formed before the work function layer 122 to interface the gate dielectric layer 120 with the subsequently formed work function layer 122. The barrier layer may also be used to prevent diffusion between the gate dielectric layer 120 and the work function layer 122. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

Afterwards, a conductive filling layer 124 is deposited over the work function layer 122 to fill the remaining space of the recess 118 over the region 20, as shown in FIG. 1E in accordance with some embodiments. The conductive filling layer 124 is made of or includes a metal material. The metal material may include tungsten, aluminum, copper, cobalt, one or more other suitable materials, or a combination thereof. The conductive filling layer 124 may be deposited using a CVD process, an ALD process, a PVD process, an electroplating process, an electroless plating process, one or more other applicable processes, or a combination thereof.

In some embodiments, a blocking layer is formed over the work function layer 122 before the formation of the conductive filling layer 124. The blocking layer may be used to prevent the subsequently formed conductive filling layer 124 from diffusing or penetrating into the work function layer 122. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Many variations and/or modifications can be made to embodiments of the disclosure. In some other embodiments, upper portions of the spacer elements 110 are partially removed to enlarge the recesses 118 before the depositions of the gate dielectric layer 120, the work function layer 122, and the conductive filling layer 124. An anisotropic etching process may be used to partially remove the spacer elements 110. Since the upper portions of the recesses 118 are widened, the subsequent deposition processes of the gate dielectric layer 120, the work function layer 122, and the conductive filling layer 124 may become easier.

As shown in FIG. 1F, a planarization process is performed to remove the portions of the gate dielectric layer 120, the work function layer 122, and the conductive filling layer 124 that are outside of the recesses 118, in accordance with some embodiments. As a result, the remaining portions of the gate dielectric layer 120 and the work function layer 122 form a metal gate stack 126A. The remaining portions of the gate dielectric layer 120, the work function layer 122, and the conductive filling layer 124 form a metal gate stack 126B. The planarization process may include a CMP process, a grinding process, an etching process, a dry polishing process, one or more other applicable processes, or a combination thereof.

As shown in FIG. 1G, a cleaning treatment 128 is performed on the surfaces of the metal gate stacks 126A and 126B, in accordance with some embodiments. The cleaning treatment 128 may be used to remove native oxide materials that are grown on the surfaces of the work function layer 122 and the conductive filling layer 124. After the removal of the native oxide materials, subsequent processes may be performed more smoothly.

Figure 2:
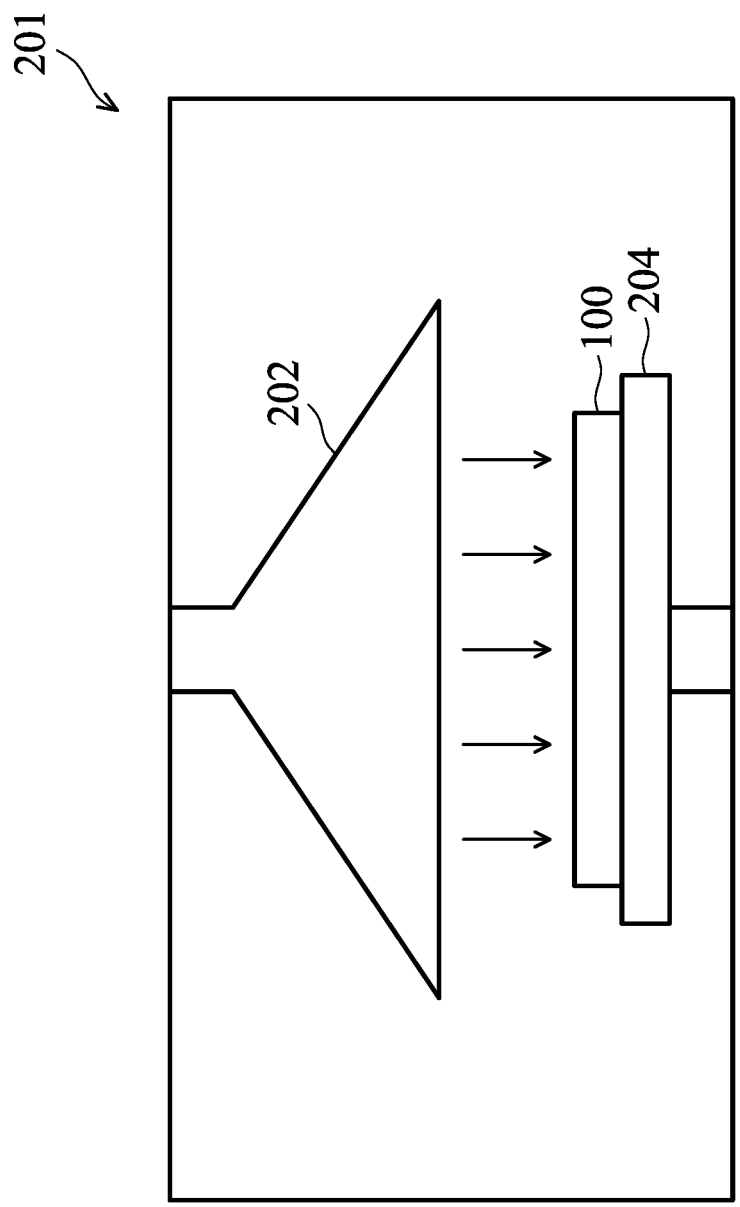
FIG. 2 shows a process chamber used in some stages of a process for forming a semiconductor device structure, in accordance with some embodiments.

In some embodiments, the cleaning treatment 128 involves a plasma treatment on the metal gate stacks 126A and 126B. FIG. 2 shows a process chamber 201 used in some stages of a process for forming a semiconductor device structure, in accordance with some embodiments. In some embodiments, the cleaning treatment 128 is performed in the process chamber 201.

In some embodiments, the process chamber 201 includes a plasma provider 202 and a substrate holder 204. The plasma provider 202 may excite a provided reaction gas mixture into plasma. Then, the generated plasma may be directed onto the surface of the semiconductor substrate 100 for performing the cleaning treatment 128. The substrate holder 204 may be used to hold the semiconductor substrate 100. The substrate holder 204 may also be used to apply bias to the semiconductor substrate 100 and/or change the temperature of the semiconductor substrate 100.

In some embodiments, the reaction gas mixture used in the cleaning treatment 128 includes $Cl_2$, $O_2$, and $N_2$. The processing pressure of the process chamber 201 may be kept in a range from about 1 mtorr to about 5 mtorr. The power used for exciting the reaction gas mixture into plasma may be in a range from about 300 W to about 800 W. The bias applied to the semiconductor substrate 100 may be in a range from about 50 V to about 150 V. The duty cycle may be in a range from about 10 to about 30. The operation time of the cleaning treatment 128 may be in a range from about 5 seconds to about 15 seconds.

As shown in FIG. 1H, a protection layer 130 is formed on the surfaces treated by the cleaning treatment 128, in accordance with some embodiments. In some embodiments, the protection layer 130 is in-situ formed in the process chamber 201 right after the cleaning treatment 128 without taking the semiconductor substrate 100 out of the process chamber 201. Therefore, new native oxide materials are prevented from being grown on the surfaces of the metal gate stacks 126A and 126B. In some embodiments, the protection layer 130 is made of or includes a polymer material.

In some embodiments, the formation of the protection layer 130 involves using plasma. In some embodiments, the reaction gas mixture used for forming the protection layer 130 includes $Cl_2$, $BCl_3$, $CH_4$, and Ar. The processing pressure of the process chamber 201 may be kept in a range from about 1 mtorr to about 6 mtorr. The power used for exciting the reaction gas mixture into plasma may be in a range from about 300 W to about 800 W. The bias applied to the semiconductor substrate 100 may be in a range from about 20 V to about 50 V. The duty cycle may be in a range from about 20 to about 50. The operation time for forming the protection layer 130 may be in a range from about 10 seconds to about 60 seconds.

In some embodiments, the protection layer 130 has a greater deposition rate over the region 20 than over the region 10 since the distribution densities of the metal gate stacks over the regions 10 and 20 are different. The portion of the protection layer 130 over the region 10 is formed to have a thickness $T_1$. The portion of the protection layer 130 over the region 20 is formed to have a thickness $T_2$. In some embodiments, the thickness $T_2$ is greater than the thickness $T_1$. The protection layer 130 may be used to control or balance the etching loading on the metal gate stacks 126A and 126B that have different widths.

As shown in FIG. 1I, an etching back process is used to remove the protection layer 130 and upper portions of the metal gate stacks 126A and 126B, in accordance with some embodiments. As a result, recesses 132 are formed, as shown in FIG. 1I. Due to the protection layer 130 that controls or balances the etching loading of different regions 10 and 20, the recesses 132 over the regions 10 and 20 have substantially the same depth.

In some embodiments, the etching back process is a dry etching process that involves using plasma. In some embodiments, the etching back process is performed at a low temperature, which allows a high etching selectivity between the work function layer 122 (or the conductive filling layer 124) and the gate dielectric layer 120. In some embodiments, the dry etching process partially remove the work function layer 122 and the conductive filling layer 124 while the gate dielectric layer 120 is substantially not etched or only slightly etched. The gate dielectric layer 120 may protect the inner sidewalls of the spacer elements 110. Therefore, the spacer elements 110 may sustain without being damaged during a subsequent etching process for forming contact holes that expose the metal gate stacks 126A and 126B.

In some embodiments, the etching back process is in-situ performed in the process chamber 201 right after the formation of the protection layer 130 without taking the semiconductor substrate out of the process chamber 201. In some embodiments, the reaction gas mixture used in the etching back process includes a first halogen-containing gas and a second halogen-containing gas. The second halogen-containing gas has a greater molecular weight than that of the first halogen-containing gas. The first halogen-containing gas may include $Cl_2$, $F_2$, or another suitable gas. The second halogen-containing gas may include $BCl_3$, $SiCl_4$, or another suitable gas. In some embodiments, the reaction gas mixture further includes an inert gas. The inert gas may include Ar, He, Ne, Kr, Xe, or Rn.

In some embodiments, the first halogen-containing gas is provided at a first flow rate, and the second halogen-containing gas is provided at a second flow rate. In some embodiments, the first flow rate is faster than the second flow rate. The first flow rate of the first halogen-containing gas may be in a range from about 50 standard cubic centimeters per minute (sccm) to about 500 sccm. The second flow rate of the second halogen-containing gas may be in a range from about 5 sccm to about 100 sccm. The flow rate of the inert gas may be in a range from about 1 sccm to about 1000 sccm. However, in some other embodiments, the inert gas is not used.

The processing pressure of the process chamber 201 for performing the etching back process may be kept in a range from about 2 mtorr to about 20 mtorr. The power used for exciting the reaction gas mixture into plasma may be in a range from about 200 W to about 900 W. The bias applied to the semiconductor substrate 100 may be in a range from about 50 V to about 150 V. The duty cycle may be in a range from about 3 to about 20. The operation time of the etching back process may be in a range from about 50 seconds to about 450 seconds.

As mentioned above, the etching back process is performed at a low temperature, so as to provide a high etching selectivity between the work function layer 122 (or the conductive filling layer 124) and the gate dielectric layer 120. The substrate holder shown in FIG. 2 may be used to keep the semiconductor substrate 100 as well as the metal gate stacks 126A and 126B at a desired operation temperature. The operation temperature may be in a range from about 20 degrees C. to about 55 degrees C. In some other embodiments, the operation temperature is in a range from about 45 degrees C. to about 50 degrees C.

By using the low operation temperature, both the etching rate of the gate dielectric layer 120 and the etching rate of the work function layer 122 (or the conductive filling layer 124) are reduced. At the operation temperature range mentioned above, in some embodiments, the reduction in the etching rate of the gate dielectric layer 120 is much greater than the reduction in the etching rate of the work function layer 122 (or the conductive filling layer 124). The etching of the work function layer 122 (or the conductive filling layer 124) becomes a little bit slower while the etching of the gate dielectric layer 120 becomes much slower. Therefore, the etching selectivity between the work function layer 122 (or the conductive filling layer 124) and the gate dielectric layer 120 is significantly increased. In some embodiments, the etching selectivity of the work function layer 122 to the gate dielectric layer 120 is increased to be over 15 or even over 17.

In some other cases, the operation temperature is not in the range mentioned above. In some cases, if the operation temperature is high (such as higher than about 55 degrees C. or higher than about 80 degrees C.), the etching selectivity between the work function layer 122 (or the conductive filling layer 124) and the gate dielectric layer 120 might not be sufficient. A greater amount of gate dielectric layer 120 may be removed. Upper portions of the inner sidewalls of the spacer elements 110 are thus exposed without being protected by the gate dielectric layer 120. As a result, the spacer elements 110 may be damaged if contact holes are subsequently formed to expose the metal gate stacks 126A and 126B. The contact holes might penetrate through the spacer elements 110 to expose conductive contacts electrically connected to the epitaxial structures 112A and/or 112B. Short circuiting between the metal gate stacks and the epitaxial structures may be formed.

In some other cases, if the operation temperature is lower than about 20 degrees C., the etching back process may be too slow due to the low temperature. The wafer throughput may be reduced too much, which is also not desired.

Many variations and/or modifications can be made to embodiments of the disclosure. In some other embodiments, the reaction gas mixture used in the etching back process further includes an oxygen-containing gas. The oxygen-containing gas may include $O_2$, $O_3$, NO, $NO_2$, or another suitable gas. By adding the oxygen-containing gas, the etching rate of the gate dielectric layer 120 may be reduced further. It might be possible that the plasma generated from the oxygen-containing gas reacts with the second halogen-containing gas or the plasma generated from the second halogen-containing gas. As a result, the resulted plasma may have radicals that substantially do not react with the gate dielectric layer 120. Therefore, the etching selectivity of the work function layer 122 (or the conductive filling layer 124) to the gate dielectric layer 120 is significantly increased.

The flow rate of the oxygen-containing gas may be in a range from about 1 sccm to about 20 sccm. In some embodiments, the ratio of the flow rate of the oxygen-containing gas to the flow rate of the second halogen-containing gas is in a range from about 0.05 to about 0.6.

In some cases, if the flow rate ratio is greater than about 0.6, the flow rate of the oxygen-containing gas may be too high. The metal gate stacks 126A and 126B might have the risk to be oxidized, which might degrade the performance of the metal gate stacks 126A and 126B.

As shown in FIG. 1J, protection elements 134A and 134B are formed in the recesses 132, in accordance with some embodiments. In some embodiments, the top surfaces of the protection elements 134A and 134B are substantially level with the top surface of the dielectric layer 116. In some embodiments, the protection elements 134A and 134B are made of or include a dielectric material. The dielectric material may include silicon nitride, silicon carbide, silicon carbon nitride, silicon oxynitride, one or more other suitable materials, or a combination thereof. In some embodiments, the protection elements 134A and 134B are substantially free of oxygen.

In some embodiments, a protection material layer is deposited over the structure shown in FIG. 1I to overfill the recesses 132. The protection material layer may be deposited using a CVD process, an ALD process, a FCVD process, a spin-on process, another applicable process, or a combination thereof.

Afterwards, the portion of the protection material layer outside of the recess 132 is removed, in accordance with some embodiments. As a result, the remaining portions of the protection material layer in the recess 132 form the protection elements 134A and 134B, as shown in FIG. 1J. In some embodiments, a planarization process is used to partially remove the protection material layer outside of the recesses 132. The planarization process may include a CMP process, a grinding process, an etching process, a dry polishing process, one or more other applicable processes, or a combination thereof.

As shown in FIG. 1K, conductive contacts 136A and 136B are formed in the dielectric layer 116, in accordance with some embodiments. The conductive contacts 136A and 136B further penetrate through the etch stop layer 114 to be electrically connected to the epitaxial structures 112A and 112B, respectively. The conductive contacts 136A and 136B may be made of or include cobalt, tungsten, ruthenium, aluminum, copper, gold, one or more other suitable materials, or a combination thereof.

In some embodiments, one or more photolithography processes and one or more etching processes are used to form contact holes that expose the epitaxial structures 112A and 112B. Afterwards, metal-semiconductor compound regions (such as metal silicide regions) may be formed on the expose surfaces of the epitaxial structures 112A and 112B. Barrier layers or barrier regions may be formed along the sidewalls of the contact holes. Then, a conductive material is deposited to overfill the contact holes. A planarization process is performed to remove the portion of the conductive material outside of the contact holes. As a result, the remaining portions of the conductive material inside the contact holes form the conductive contacts 136A and 136B.

As shown in FIG. 1L, an etch stop layer 138 and a dielectric layer 140 are sequentially deposited over the structure shown in FIG. 1K, in accordance with some embodiments. The material and formation method of the etch stop layer 138 may be the same as or similar to those of the etch stop layer 114. The material and formation method of the dielectric layer 140 may be the same as or similar to those of the dielectric layer 116. A planarization process is then used to provide the dielectric layer 140 with a substantially planar top surface. The planarization process may include a CMP process, a grinding process, an etching process, a dry polishing process, one or more other applicable processes, or a combination thereof.

As shown in FIG. 1M, contact openings 142 are formed to expose the metal gate stacks 126A and 126B, in accordance with some embodiments. The contact openings 142 penetrate through the dielectric layer 140, the etch stop layer 138, and the protection elements 134A and 134B. One or more photolithography processes and one or more etching processes may be used to form the contact openings 142. In some embodiments, an overlay shift might occur such that the gate dielectric layer 120 is exposed by the conduct opening 142.

During the etching process for forming the contact openings 142, the spacer elements 110 are protected by the gate dielectric layer 120. The etchant is prevented from penetrating through the spacer elements 110 and reaching the conductive contacts 136A and/or 136B. The conductive contacts 136A and 136B are protected by the gate dielectric layer 120, the spacer elements 110, and the etch stop layer 114 without being exposed by the contact openings 142. Short circuiting between the conductive contacts 136A (or 136B) and other conductive structures to be formed in the contact openings 142 is prevented.

As shown in FIG. 1N, conductive contacts 144A and 144B are formed in the contact openings 142, in accordance with some embodiments. The conductive contacts 144A and 144B form electrical connections to the metal gate stacks 126A and 126B, respectively. The conductive contacts 144A and 144B may be made of or include tungsten, ruthenium, cobalt, copper, aluminum, gold, one or more other suitable materials, or a combination thereof. Due to the protection of the gate dielectric layer 120, the conductive contacts 144A and 144B and the conductive contacts 136A and 136B are prevented from being electrically shorted together.

In some embodiments, metal-semiconductor compound regions (such as metal silicide regions) are formed on the surfaces of the metal gate stacks 126A and 126B exposed by the contact openings 142 shown in FIG. 1M. Barrier layers or barrier regions may be formed along the sidewalls of the contact openings 142. Then, a conductive material is deposited to overfill the contact openings 142. A planarization process is performed to remove the portion of the conductive material outside of the contact openings 142. As a result, the remaining portions of the conductive material inside the contact openings 142 form the conductive contacts 144A and 144B.

Figure 3A:
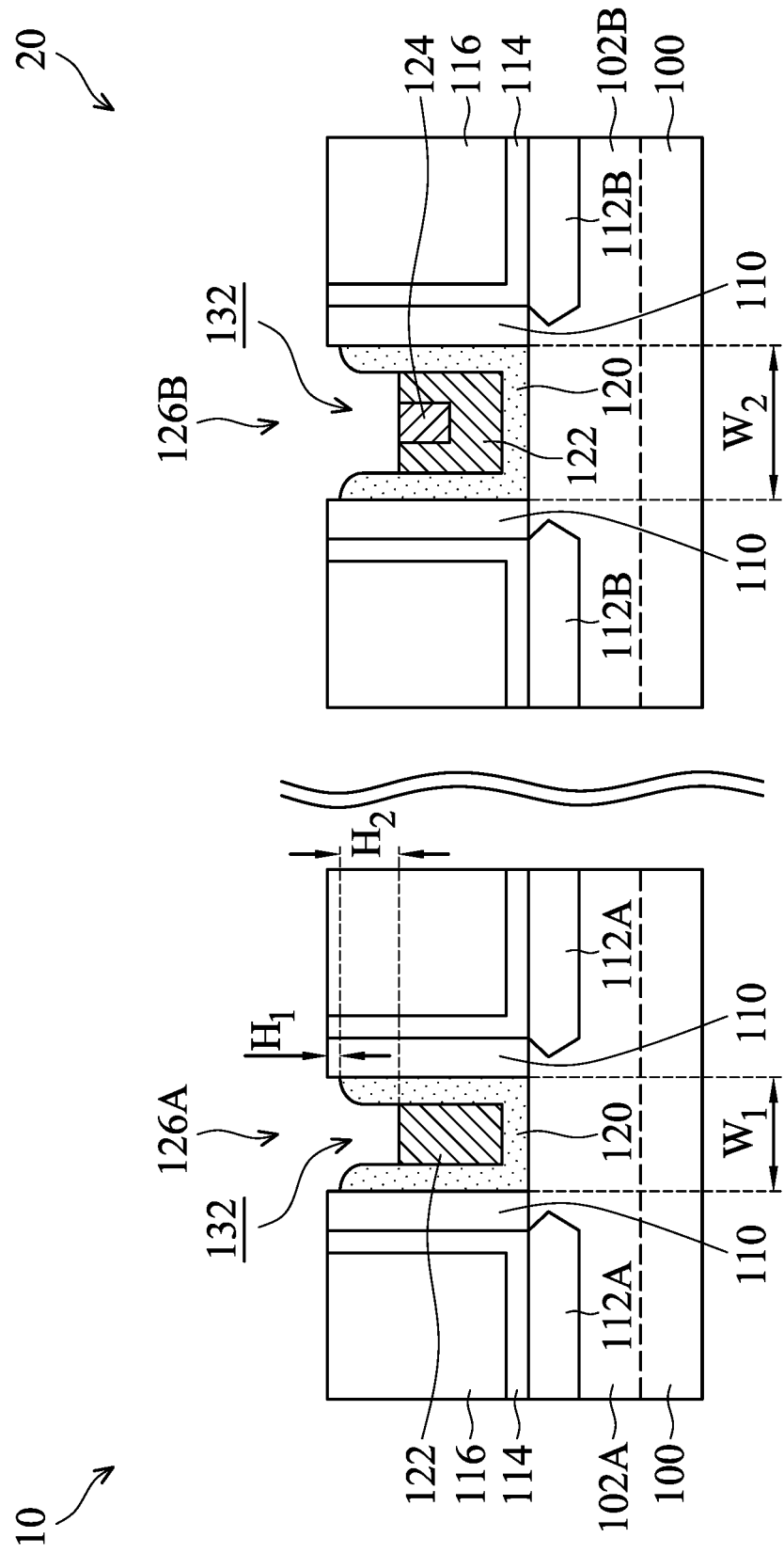
FIGS. 3A-3B are cross-sectional views of various stages of a process for forming a semiconductor device structure, in accordance with some embodiments.
Figure 3B:
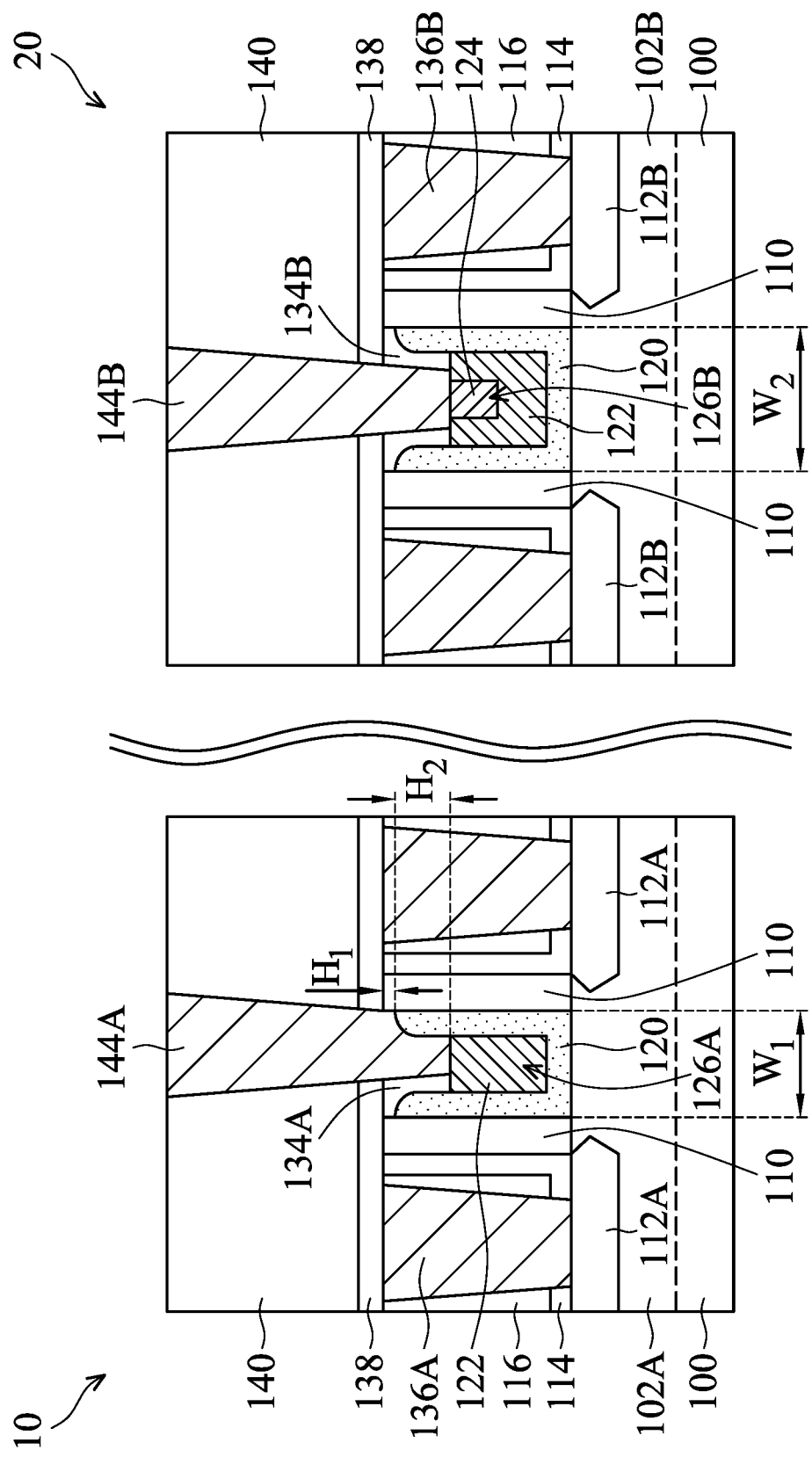

FIGS. 3A-3B are cross-sectional views of various stages of a process for forming a semiconductor device structure, in accordance with some embodiments. As shown in FIG. 3A, a structure similar to the structure shown in FIG. 1I is received or formed. In some embodiments, the gate dielectric layer 120 is slightly etched during the etching back process even if the etching selectivity of the work function layer 122 to the gate dielectric layer has been significantly increased due to the low operation temperature and/or the adding of the oxygen-containing gas.

As shown in FIG. 3A, the top of the spacer element 110 is higher than the top of the gate dielectric layer 120 by a height difference $H_1$. The top of the gate dielectric layer 120 is higher than the top of the work function layer 122 by a height difference $H_2$. Due to the slow etching rate of the gate dielectric layer 120, the height difference $H_1$ is smaller than the height difference $H_2$. In some embodiments, the ratio ($H_1/H_2$) of the height difference $H_1$ to the height difference $H_2$ is smaller than about 1/14. In some cases, if the ratio ($H_1/H_2$) is greater 1/14, the height difference $H_1$ may be too large. As a result, the gate dielectric layer 120 might not be able to provide sufficient protection to the spacer elements 110.

Afterwards, the processes the same as or similar to the processes illustrated in FIGS. 1J-1L are performed, in accordance with some embodiments. As a result, the structure shown in FIG. 3B is formed.

In some embodiments, the conductive contact 144A is in direct contact with the gate dielectric layer 120. In some embodiments, the conductive contact 144A is in direct contact with the spacer element 110. Since the gate dielectric layer 120 is only etched slightly, the exposed area of the spacer element 110 is small. The gate dielectric layer 120 still provides sufficient protection to the spacer elements 110. The spacer element 110 is prevented from being damaged. The electrical isolation between the conductive contacts 144A and 112A is ensured. The performance and reliability of the semiconductor device structure are maintained.

Embodiments of the disclosure relate to a gate replacement process for forming a metal gate stack. The metal gate stack includes a gate dielectric layer and a work function layer. Afterwards, the metal gate stack is etched back to form space for containing a protection element. The etching back process is performed at a low temperature to ensure high etching selectivity of the work function layer to the gate dielectric layer. The gate dielectric layer is substantially not etched or slightly etched. The gate dielectric layer is capable of protecting spacer elements beside the metal gate stack to sustain a subsequent etching process for forming a contact opening to the metal gate stack. The performance and reliability of the semiconductor device structure are greatly improved.

In accordance with some embodiments, a method for forming a semiconductor device structure is provided. The method includes forming a dummy gate stack over a semiconductor substrate and forming spacer elements over sidewalls of the dummy gate stack. The method also includes removing the dummy gate stack to form a recess between the spacer elements and forming a metal gate stack in the recess. The method further includes etching back the metal gate stack while the metal gate stack is kept at a temperature that is in a range from about 20 degrees C. to about 55 degrees C. In addition, the method includes forming a protection element over the metal gate stack after etching back the metal gate stack.

In accordance with some embodiments, a method for forming a semiconductor device structure is provided. The method includes forming a metal gate stack over a fin structure. The method also includes removing an upper portion of the metal gate stack using an etching process while the metal gate stack is kept at a temperature that is in a range from about 20 degrees C. to about 55 degrees C. A reaction gas mixture used in the etching process includes a first halogen-containing gas and a second halogen-containing gas. The second halogen-containing gas has a greater molecular weight than that of the first halogen-containing gas. The first halogen-containing gas is provided at a first flow rate, and the second halogen-containing gas is provided at a second flow rate. The first flow rate is faster than the second flow rate. The method further includes forming a protection element over the metal gate stack after the upper portion of the metal gate stack is removed.

In accordance with some embodiments, a semiconductor device structure is provided. The semiconductor device structure includes a semiconductor substrate and a metal gate stack over the semiconductor substrate. The metal gate stack includes a gate dielectric layer and a work function layer over the gate dielectric layer. The semiconductor device structure also includes a spacer element over a sidewall of the metal gate stack. A top of the spacer element is higher than a top of the gate dielectric layer by a first height difference. The top of the gate dielectric layer is higher than a top of the work function layer by a second height difference. A ratio of the first height difference to the second height difference is smaller than about 1/14.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a semiconductor substrate;
a metal gate stack over the semiconductor substrate, wherein the metal gate stack comprises a gate dielectric layer and a work function layer over the gate dielectric layer, the gate dielectric layer has a vertical sidewall protruding from a top surface of the work function layer;
a protection element over the metal gate stack, wherein the vertical sidewall of the gate dielectric layer is in direct contact with the protection element; and
a spacer structure over a sidewall of the metal gate stack, wherein a top of the spacer structure is higher than a top of the gate dielectric layer by a first height difference, the top of the gate dielectric layer is higher than a top of the work function layer by a second height difference, and a ratio of the first height difference to the second height difference is smaller than about 1/14.

2. The semiconductor device structure as claimed in claim 1, wherein the spacer structure extends along a sidewall of the protection element.

3. The semiconductor device structure as claimed in claim 1, further comprising a conductive contact penetrating through the protection element to be in electrical contact with the metal gate stack.

4. The semiconductor device structure as claimed in claim 3, wherein the conductive contact is in direct contact with the gate dielectric layer.

5. The semiconductor device structure as claimed in claim 3, wherein the conductive contact is separated from the gate dielectric layer by the protection element.

6. The semiconductor device structure as claimed in claim 3, wherein the conductive contact is separated from the spacer structure by the protection element.

7. The semiconductor device structure as claimed in claim 3, wherein the conductive contact is in direct contact with the spacer structure.

8. The semiconductor device structure as claimed in claim 1, wherein the protection element covers the top of the gate dielectric layer.

9. A semiconductor device structure, comprising:
a substrate;
a metal gate stack over the substrate, wherein the metal gate stack comprises a gate dielectric layer and a work function layer over the gate dielectric layer, wherein the gate dielectric layer has a curved sidewall and a vertical sidewall;
a protection element over the metal gate stack, wherein the protection element is in direct contact with the curved sidewall and the vertical sidewall; and
a spacer structure over a sidewall of the metal gate stack, wherein a topmost surface of the gate dielectric layer is lower than a topmost surface of the spacer structure, and the topmost surface of the gate dielectric layer is closer to the topmost surface of the spacer structure than a topmost surface of the work function layer.

10. The semiconductor device structure as claimed in claim 9, further comprising a conductive contact penetrating through the protection element and electrically connected to the work function layer, wherein the curved sidewall is extended from the vertical sidewall towards the spacer structure.

11. The semiconductor device structure as claimed in claim 10, wherein the conductive contact is in direct contact with the topmost surface of the gate dielectric layer.

12. The semiconductor device structure as claimed in claim 11, wherein the conductive contact is in direct contact with the gate dielectric layer.

13. A semiconductor device structure, comprising:
a substrate;
a metal gate stack over the substrate, wherein the metal gate stack comprises a gate dielectric layer and a work function layer over the gate dielectric layer, the gate dielectric layer has a topmost surface, a curved sidewall, an outer sidewall, and an inner vertical sidewall opposite to the outer sidewall;
a protection element over the metal gate stack, wherein the protection element covers the topmost surface of the gate dielectric layer, and the protection element extends along the curved sidewall of the gate dielectric layer and extends conformally along the inner vertical sidewall of the gate dielectric layer, wherein the inner vertical sidewall of the gate dielectric layer is between the outer sidewall and the protection element; and
a spacer structure extending along a sidewall of the metal gate stack and a sidewall of the protection element.

14. The semiconductor device structure as claimed in claim 13, further comprising a conductive contact electrically connected to the metal gate stack, wherein the protection element surrounds a lower portion of the conductive contact.

15. The semiconductor device structure as claimed in claim 14, wherein the conductive contact is separated from the gate dielectric layer by the protection element.

16. The semiconductor device structure as claimed in claim 14, wherein the conductive contact is in direct contact with the protection element and the gate dielectric layer.

17. The semiconductor device structure as claimed in claim 16, wherein the conductive contact is in direct contact with the spacer structure.

18. The semiconductor device structure as claimed in claim 1, further comprising:
   a second metal gate stack over the semiconductor substrate, wherein the second metal gate stack is wider than the metal gate stack, and the second metal gate stack comprises a second gate dielectric layer and a second work function layer over the second gate dielectric layer;
   a second protection element over the second metal gate stack, wherein a second vertical sidewall of the second gate dielectric layer is in direct contact with the second protection element;
   a first conductive contact penetrating through the protection element to be in electrical contact with the metal gate stack, wherein the first conductive contact is in direct contact with the gate dielectric layer; and
   a second conductive contact penetrating through the protection element to be in electrical contact with the metal gate stack, wherein the second conductive contact is separated from the second gate dielectric layer by the second protection element.

19. The semiconductor device structure as claimed in claim 1, further comprising:
   a second metal gate stack over the semiconductor substrate, wherein the second metal gate stack is wider than the metal gate stack, the second metal gate stack comprises a second gate dielectric layer and a second work function layer;
   a second protection element over the second metal gate stack, wherein a second vertical sidewall of the second gate dielectric layer is in direct contact with the second protection element;
   a first conductive contact penetrating through the protection element to be in electrical contact with the metal gate stack, wherein the first conductive contact is in direct contact with the curved sidewall and the vertical sidewall of the gate dielectric layer; and
   a second conductive contact penetrating through the protection element to be in electrical contact with the metal gate stack, wherein the second conductive contact is separated from the second gate dielectric layer by the second protection element.

20. The semiconductor device structure as claimed in claim 13, wherein the protection element is in direct contact with the inner vertical sidewall of the gate dielectric layer.

* * * * *